US010242948B2

United States Patent
Shim et al.

(10) Patent No.: US 10,242,948 B2
(45) Date of Patent: Mar. 26, 2019

(54) SEMICONDUCTOR DEVICE AND METHOD OF USING SUBSTRATE HAVING BASE AND CONDUCTIVE POSTS TO FORM VERTICAL INTERCONNECT STRUCTURE IN EMBEDDED DIE PACKAGE

(71) Applicant: STATS ChipPAC Pte. Ltd., Singapore (SG)

(72) Inventors: Il Kwon Shim, Singapore (SG); Jun Mo Koo, Singapore (SG); Pandi C. Marimuthu, Singapore (SG); Yaojian Lin, Singapore (SG); See Chian Lim, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 20 days.

(21) Appl. No.: 15/380,788

(22) Filed: Dec. 15, 2016

(65) Prior Publication Data

US 2017/0098610 A1 Apr. 6, 2017

Related U.S. Application Data

(62) Division of application No. 13/800,807, filed on Mar. 13, 2013, now Pat. No. 9,559,039.

(Continued)

(51) Int. Cl.
*H01L 23/538* (2006.01)
*H01L 23/48* (2006.01)
(Continued)

(52) U.S. Cl.
CPC ........ *H01L 23/5384* (2013.01); *H01L 21/486* (2013.01); *H01L 23/3128* (2013.01);
(Continued)

(58) Field of Classification Search
CPC ............ H01L 23/5384; H01L 23/3128; H01L 23/5386

See application file for complete search history.

(56) References Cited

U.S. PATENT DOCUMENTS 6,010,769 A 1/2000 Sasaoka et al.
7,619,901 B2 11/2009 Eichelberger et al.
(Continued)

FOREIGN PATENT DOCUMENTS

CN 1842906 A 10/2006

*Primary Examiner* — Errol V Fernandes
(74) *Attorney, Agent, or Firm* — Brian M. Kaufman; Robert D. Atkins; Patent Law Group: Atkins and Associates, P.C.

(57) ABSTRACT

A semiconductor device has a substrate including a base and a plurality of conductive posts extending from the base. The substrate can be a wafer-shape, panel, or singulated form. The conductive posts can have a circular, rectangular, tapered, or narrowing intermediate shape. A semiconductor die is disposed through an opening in the base between the conductive posts. The semiconductor die extends above the conductive posts or is disposed below the conductive posts. An encapsulant is deposited over the semiconductor die and around the conductive posts. The base and a portion of the encapsulant is removed to electrically isolate the conductive posts. An interconnect structure is formed over the semiconductor die, encapsulant, and conductive posts. An insulating layer is formed over the semiconductor die, encapsulant, and conductive posts. A semiconductor package is disposed over the semiconductor die and electrically connected to the conductive posts.

24 Claims, 14 Drawing Sheets

Related U.S. Application Data

(60) Provisional application No. 61/702,171, filed on Sep. 17, 2012.

(51) Int. Cl.

| | | |
|---|---|---|
| *H01L 21/48* | (2006.01) | |
| *H01L 23/498* | (2006.01) | |
| *H01L 23/00* | (2006.01) | |
| *H01L 25/10* | (2006.01) | |
| *H01L 25/00* | (2006.01) | |
| *H01L 23/31* | (2006.01) | |
| *H01L 21/56* | (2006.01) | |

(52) U.S. Cl.
CPC ...... *H01L 23/481* (2013.01); *H01L 23/49816* (2013.01); *H01L 23/5386* (2013.01); *H01L 23/5389* (2013.01); *H01L 24/19* (2013.01); *H01L 24/20* (2013.01); *H01L 24/96* (2013.01); *H01L 24/97* (2013.01); *H01L 25/105* (2013.01); *H01L 25/50* (2013.01); *H01L 21/568* (2013.01); *H01L 23/3171* (2013.01); *H01L 23/3192* (2013.01); *H01L 24/11* (2013.01); *H01L 24/13* (2013.01); *H01L 24/32* (2013.01); *H01L 24/48* (2013.01); *H01L 24/73* (2013.01); *H01L 2224/0401* (2013.01); *H01L 2224/04042* (2013.01); *H01L 2224/04105* (2013.01); *H01L 2224/1132* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/32145* (2013.01); *H01L 2224/32225* (2013.01); *H01L 2224/48091* (2013.01); *H01L 2224/48106* (2013.01); *H01L 2224/48227* (2013.01); *H01L 2224/73265* (2013.01); *H01L 2224/73267* (2013.01); *H01L 2224/9222* (2013.01); *H01L 2224/94* (2013.01); *H01L 2224/97* (2013.01); *H01L 2225/0651* (2013.01); *H01L 2225/0652* (2013.01); *H01L 2225/06568* (2013.01); *H01L 2225/06572* (2013.01); *H01L 2225/1035* (2013.01); *H01L 2225/1052* (2013.01); *H01L 2225/1058* (2013.01); *H01L 2924/00014* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/18162* (2013.01)

(56) References Cited

U.S. PATENT DOCUMENTS

| | | |
|---|---|---|
| 7,842,542 B2 | 11/2010 | Shim et al. |
| 7,993,941 B2 | 8/2011 | Huang et al. |
| 8,097,490 B1 | 1/2012 | Pagaila et al. |
| 8,105,872 B2 | 1/2012 | Pagaila et al. |
| 8,354,304 B2 | 1/2013 | Chow et al. |
| 8,896,109 B2 | 11/2014 | Pagaila et al. |
| 9,177,901 B2 | 11/2015 | Pagaila et al. |
| 9,240,380 B2 | 1/2016 | Pagaila et al. |
| 2006/0087044 A1 | 4/2006 | Goller |
| 2007/0111374 A1 | 5/2007 | Islam et al. |
| 2008/0315375 A1 | 12/2008 | Eichelberger et al. |
| 2010/0133704 A1* | 6/2010 | Marimuthu ........... H01L 21/565 257/778 |
| 2010/0289126 A1 | 11/2010 | Pagaila et al. |
| 2012/0009737 A1* | 1/2012 | Kuratomi ............. H01L 21/561 438/112 |

\* cited by examiner

SEMICONDUCTOR DEVICE AND METHOD OF USING SUBSTRATE HAVING BASE AND CONDUCTIVE POSTS TO FORM VERTICAL INTERCONNECT STRUCTURE IN EMBEDDED DIE PACKAGE

CLAIM TO DOMESTIC PRIORITY

The present application is a division of U.S. patent application Ser. No. 13/800,807, now U.S. Pat. No. 9,559, 039, filed Mar. 13, 2013, which claims the benefit of U.S. Provisional Application No. 61/702,171, filed Sep. 17, 2012, which application is incorporated herein by reference.

FIELD OF THE INVENTION

The present invention relates in general to semiconductor devices and, more particularly, to a semiconductor device and method involving a substrate having a base and conductive posts extending from the base to form a vertical interconnect structure in an embedded die package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Semiconductor packages often use conductive pillars or vias as a vertical interconnect through encapsulant around a semiconductor die, e.g., between a topside interconnect structure and bottom side interconnect structure. A via is typically formed through the encapsulant by etching or laser drilling and filled or plated with conductive material. The formation of conductive vias is time consuming and involves expensive equipment.

SUMMARY OF THE INVENTION

A need exists for a simple and cost effective vertical interconnect structure in an embedded die package. Accordingly, in one embodiment, the present invention is a semiconductor device comprising a carrier. A substrate includes a base and a plurality of conductive posts extending from the base. The substrate is disposed over the carrier with the conductive posts oriented toward the carrier. A semiconductor die is disposed over the carrier between the conductive posts. The semiconductor die is aligned with an opening of the substrate. An encapsulant is deposited over the carrier, substrate, and semiconductor die.

In another embodiment, the present invention is a semiconductor device comprising a substrate including a base and a plurality of conductive posts extending from the base. A semiconductor die is disposed between the conductive posts. An active surface of the semiconductor die is aligned with ends of the conductive posts. An encapsulant is deposited over the substrate and semiconductor die. A surface of the encapsulant is coplanar with the active surface of the semiconductor die and the ends of the conductive posts.

In another embodiment, the present invention is a semiconductor device comprising a substrate including a plurality of conductive posts and an opening formed through the substrate between the conductive posts. A semiconductor die is disposed over the substrate and aligned with the openings.

In another embodiment, the present invention is a leadframe for a semiconductor device comprising a base and an opening formed through the base. A plurality of conductive posts extends from the base around the opening.

DETAILED DESCRIPTION OF THE DRAWINGS

Figure 1:
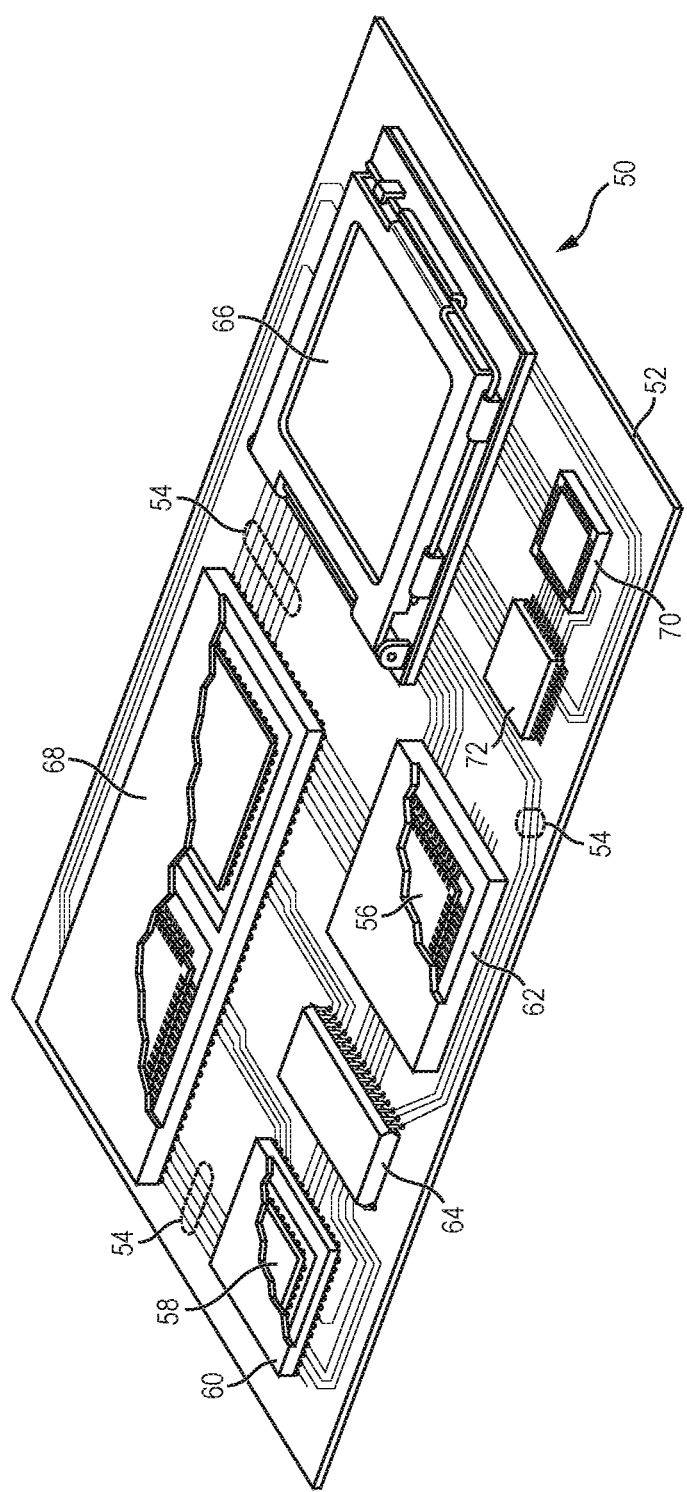
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
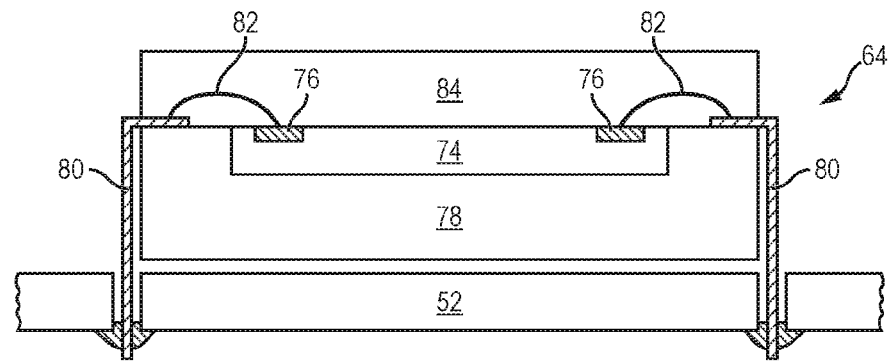
FIGS. 2a-2c illustrate further detail of the representative semiconductor packages mounted to the PCB.
Figure 2B:
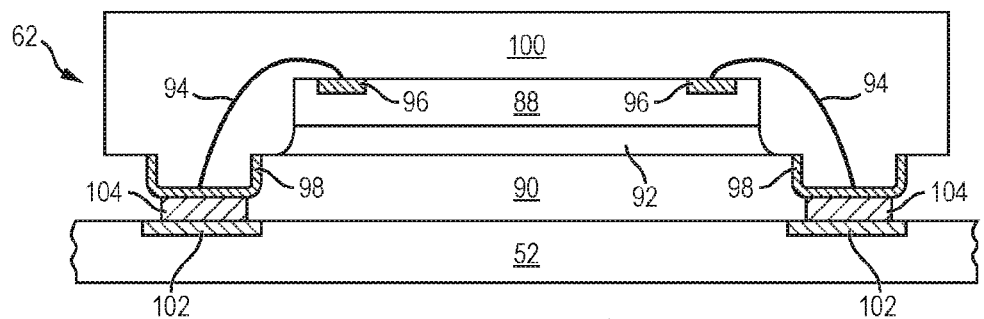
Figure 2C:
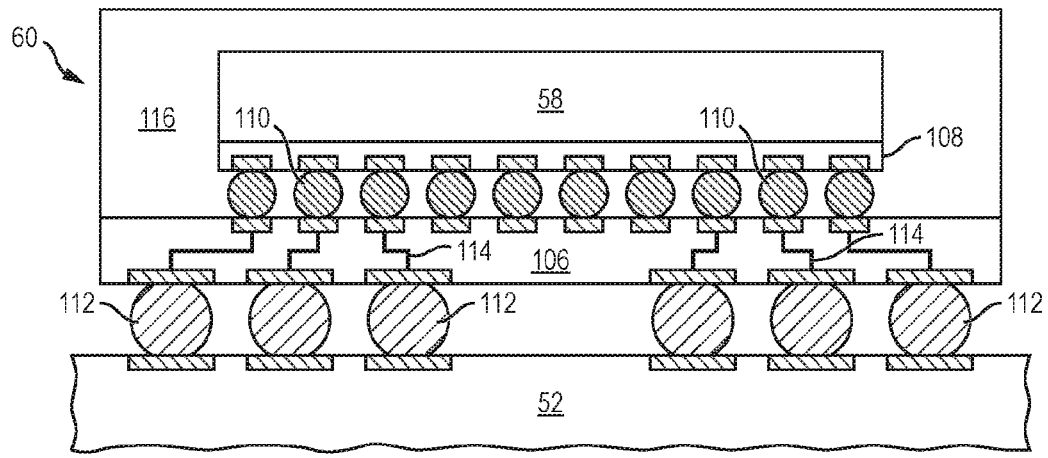

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
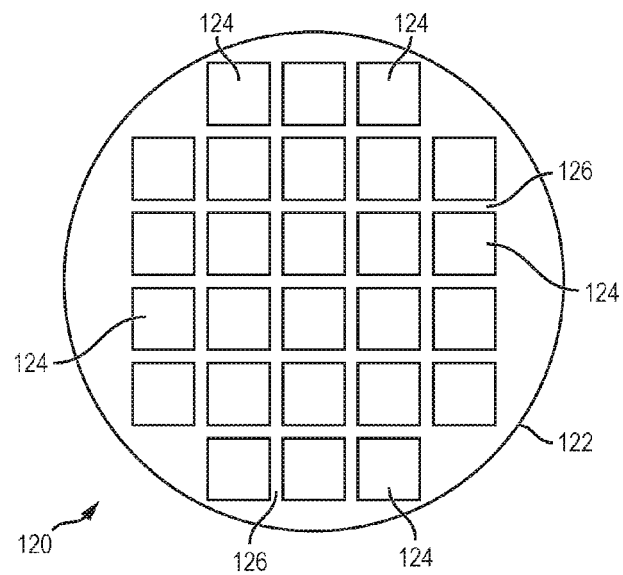
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
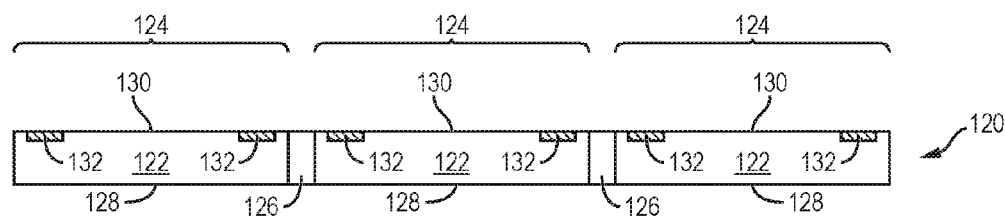

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Figure 3C:
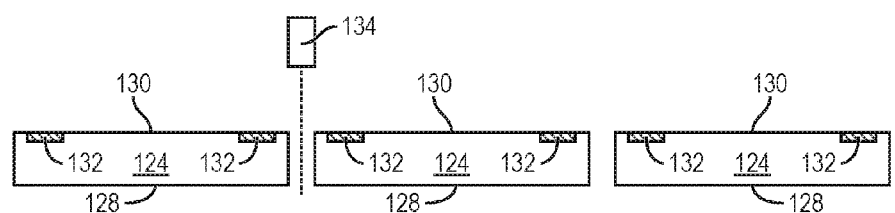

In FIG. 3c, semiconductor wafer 120 is singulated through saw street 126 using a saw blade or laser cutting tool 134 into individual semiconductor die 124.

Figure 4:
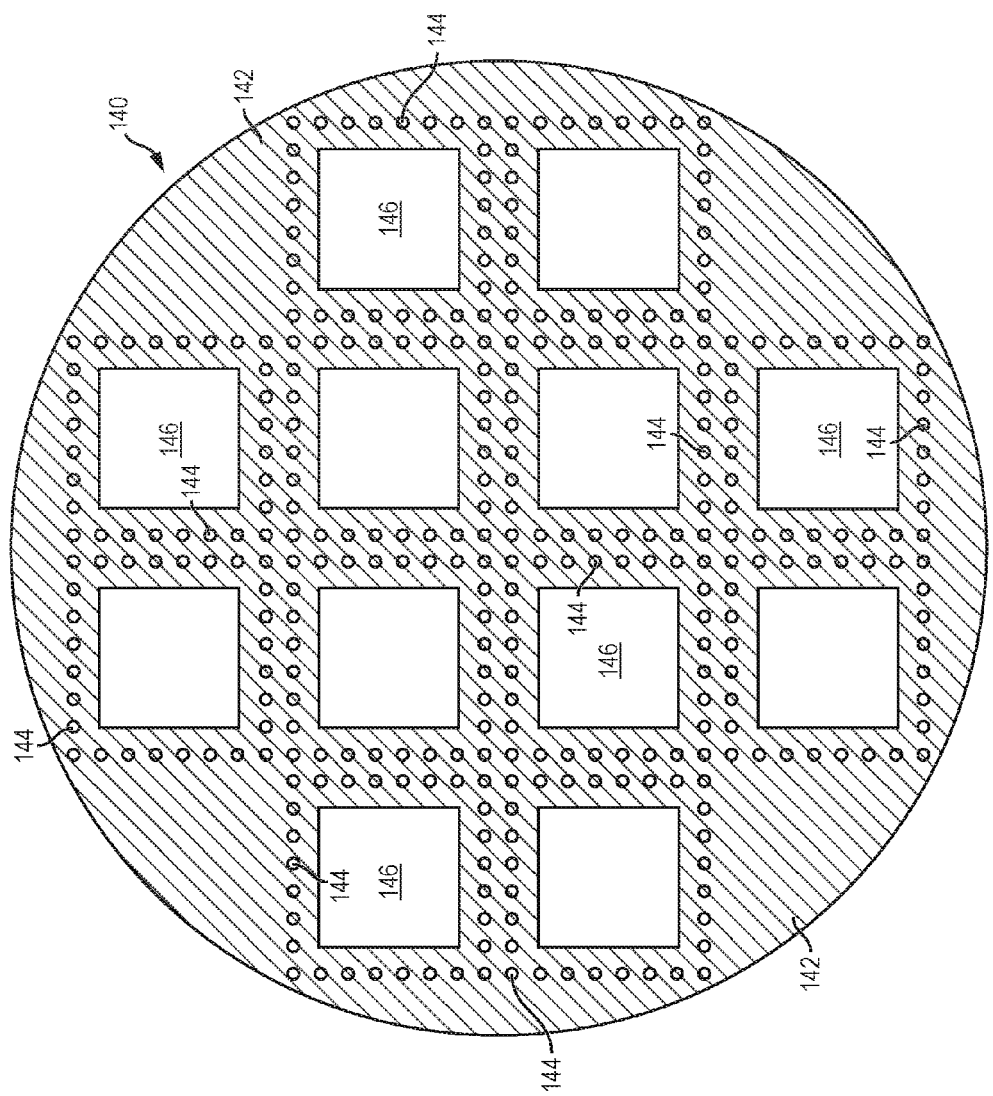
FIG. 4 illustrates a wafer-shape substrate with a base and conductive posts extending from the base.

FIG. 4 illustrates a wafer-shaped substrate or interposer 140 including a base 142 and multiple rows of conductive posts or leads 144 extending from the base. In one embodiment, substrate 140 is an un-singulated preformed or prefabricated laminated substrate made with leadframe manufacturing techniques, such as stamping. Substrate 140 includes a plurality of die openings 146 between conductive posts 144 of sufficient size for mounting a semiconductor die through the opening.

Figure 5:
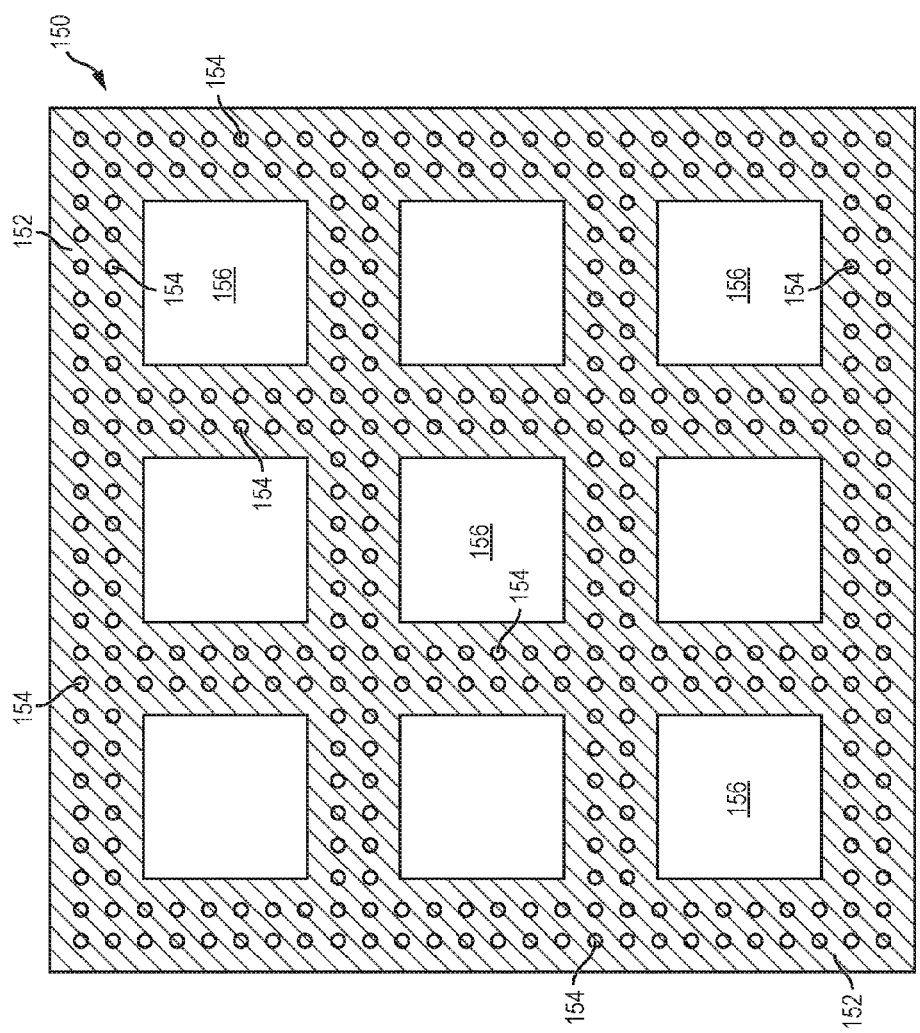
FIG. 5 illustrates a strip substrate with a base and conductive posts extending from the base.

FIG. 5 illustrates a panel or strip substrate or interposer 150 including a base 152 and multiple rows of conductive posts or leads 154 extending from the base. In one embodiment, substrate 150 is an un-singulated preformed or prefabricated laminated substrate made with leadframe manufacturing techniques, such as stamping. Substrate 150 includes a plurality of die openings 156 between conductive posts 154 of sufficient size for mounting a semiconductor die through the opening.

Figure 6A:
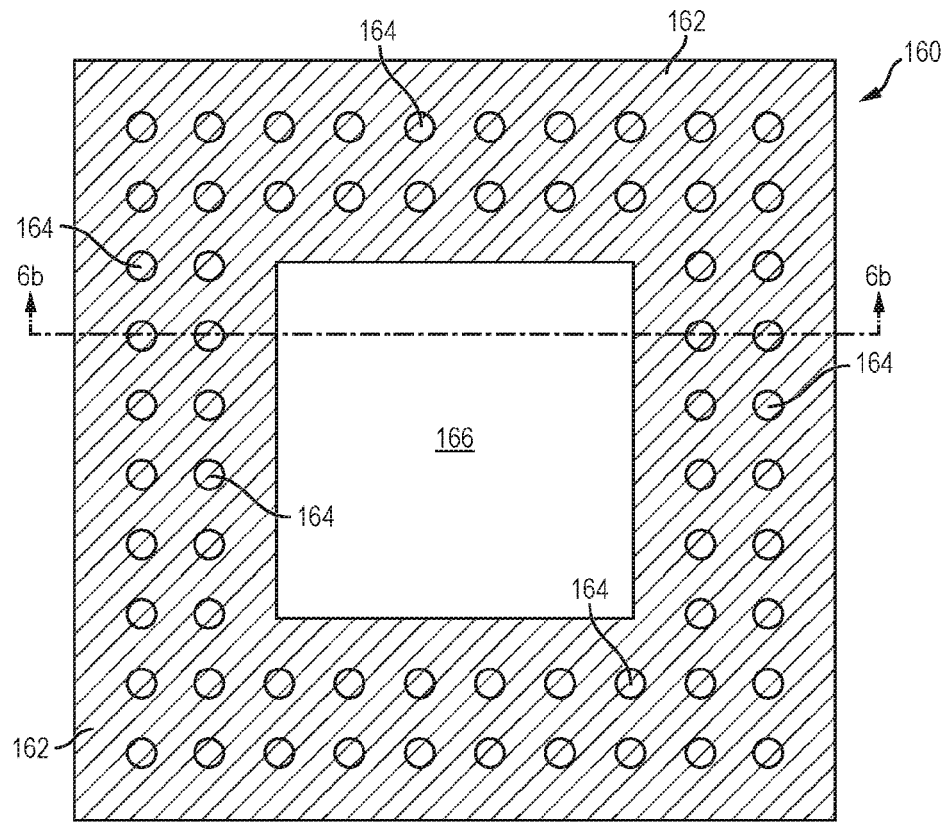
FIGS. 6a-6c illustrate a singulated substrate with a base and conductive posts extending from the base.

FIG. 6a illustrates a singulated substrate or interposer 160 including a base 162 and multiple rows of conductive posts or leads 164 extending from the base. In one embodiment, substrate 160 is a preformed or prefabricated laminated substrate made with leadframe manufacturing techniques, such as stamping. Substrates 140-160 can be gold, silver, nickel, platinum, copper, copper alloys (including one or more elements of nickel, iron, zinc, tin, chromium, silver, and phosphorous), or other suitable conductive materials. Substrate 160 includes an opening 166 between conductive posts 164 of sufficient size for mounting a semiconductor die through the opening.

Figure 6B:
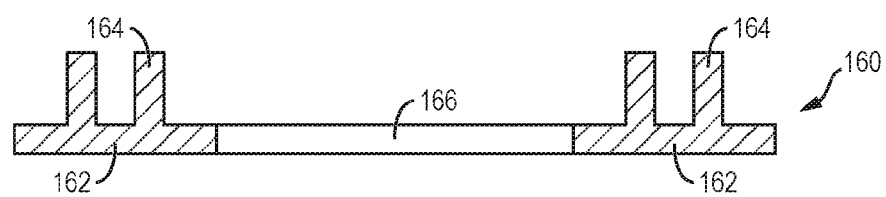
Figure 6C:
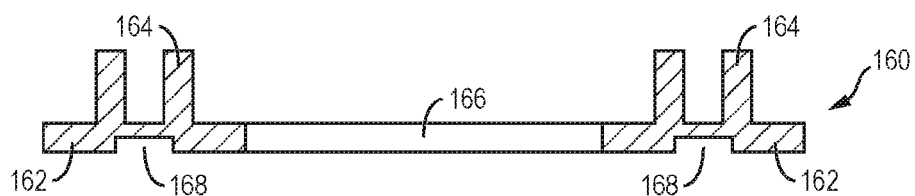
Figure 7A:
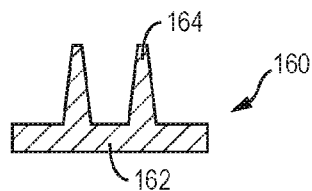
FIGS. 7a-7b illustrate alternate embodiments of the conductive posts.
Figure 7B:
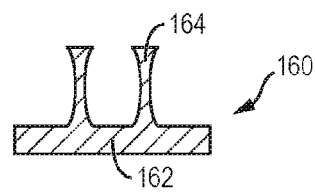

FIG. 6b illustrates a cross-sectional view of substrate 160 with base 162 and multiple rows of conductive posts or leads 164 extending from the base, as taken along line 6b-6b of FIG. 6a. FIG. 6c shows a cross-sectional view of substrate 160 with notches 168 in base 162 for reinforcement and rigidity enhancement. Conductive posts 164 can be rectangular, circular, hexagonal, or other geometric shape. In one embodiment, base 162 has a thickness of 100-200 micrometers (μm), and posts 164 have a height of 80-300 μm, diameter or cross-sectional width of 50-250 μm, and pitch of 100-500 μm. Conductive posts 164 can also have a tapered shape, as shown in FIG. 7a, with the narrower end ranging from 30-200 μm and the wider end ranging from 50-300 μm. FIG. 7b shows posts 164 with a thinner intermediate portion. By nature of extending from base 162, conductive posts 164 have a fixed spacing between posts. The base and posts of substrates 140 and 150 have a similar cross-section as FIGS. 6b-6c and 7a-7b.

Figure 8A:
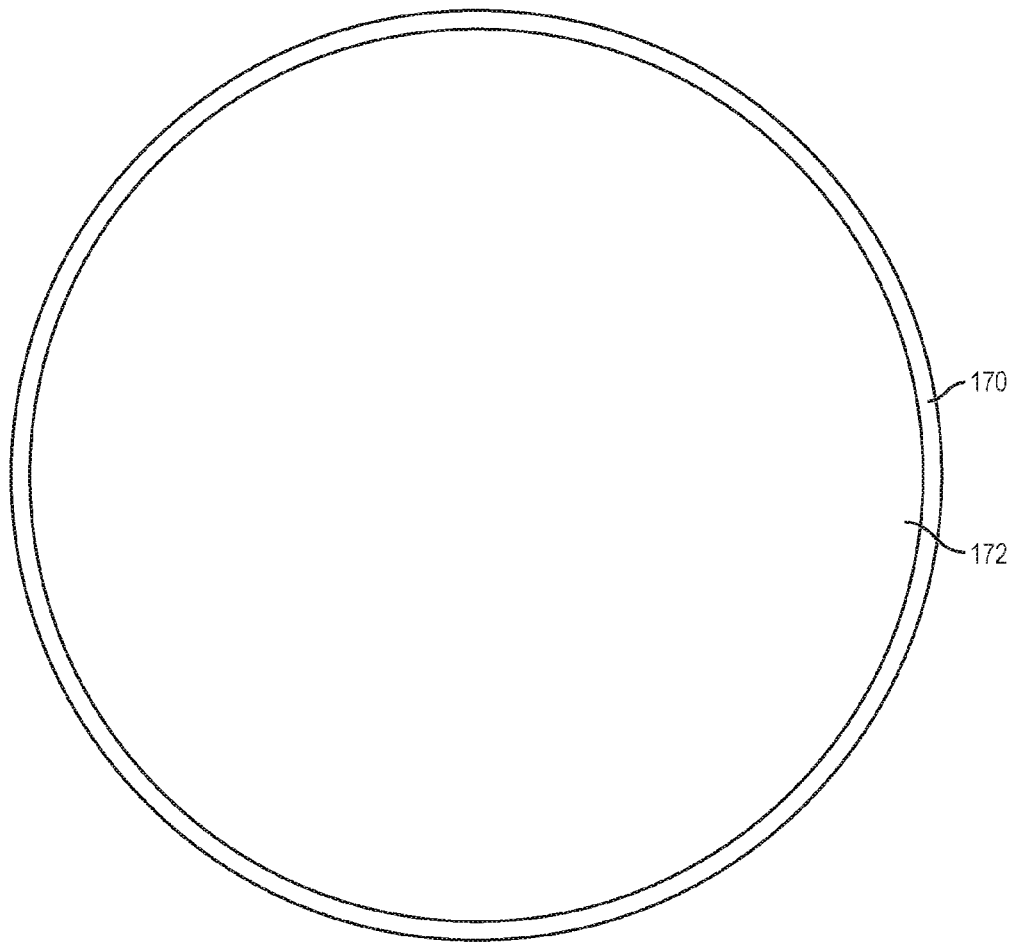
FIGS. 8a-8t illustrate a process involving a substrate having a base and conductive posts to form a vertical interconnect structure in an embedded die package.
Figure 8B:
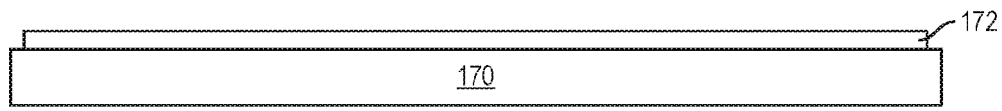
Figure 8C:
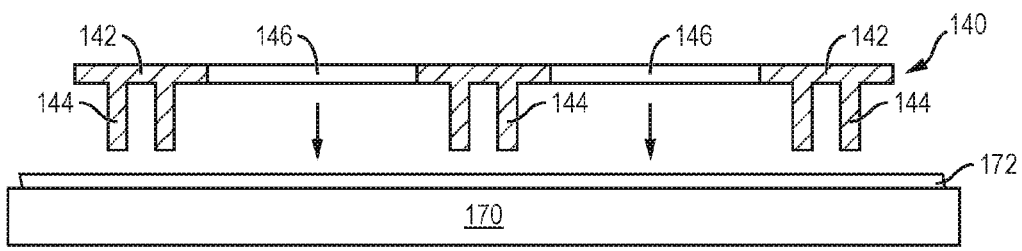
Figure 8D:
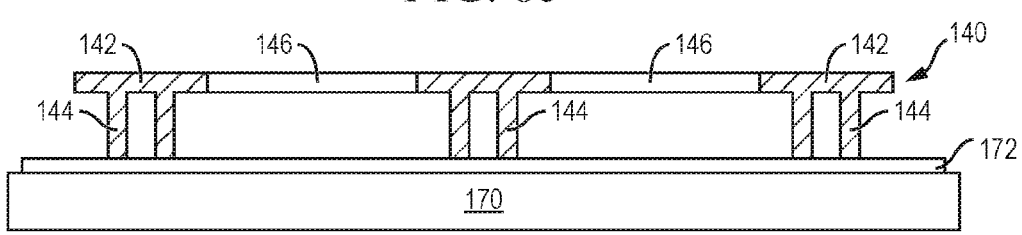
Figure 8E:
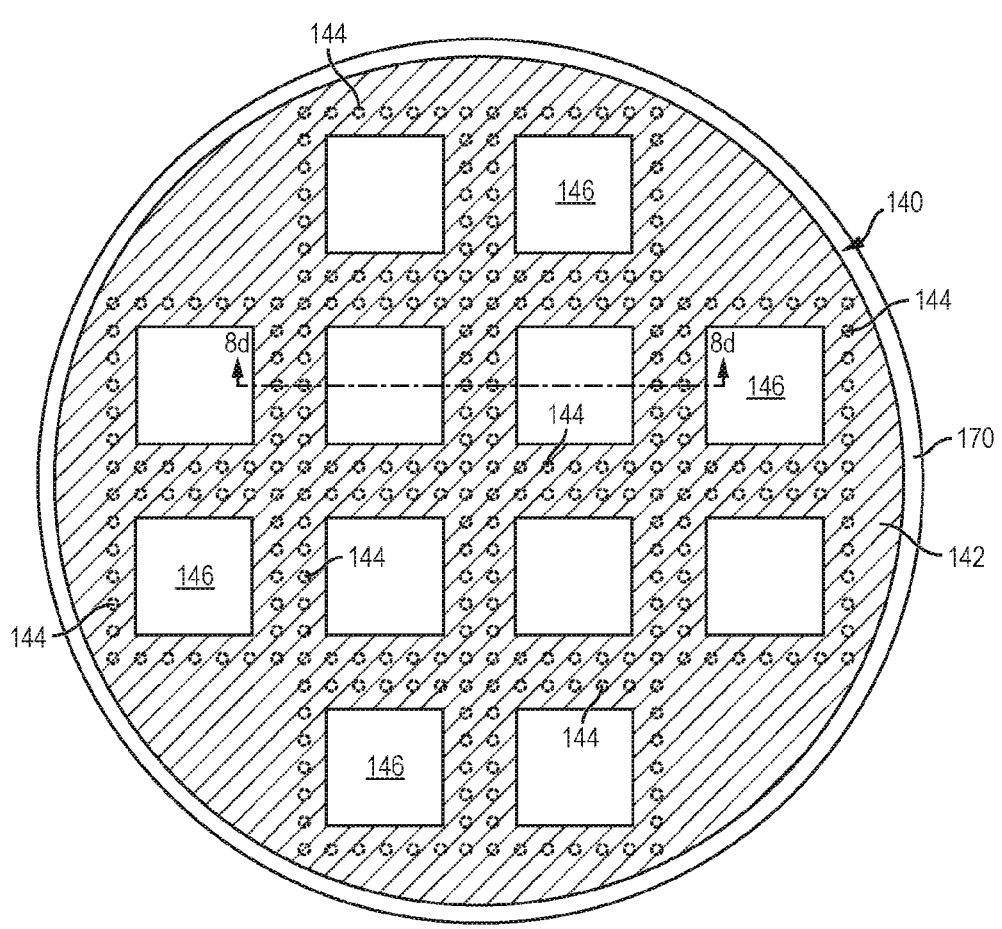
Figure 8F:
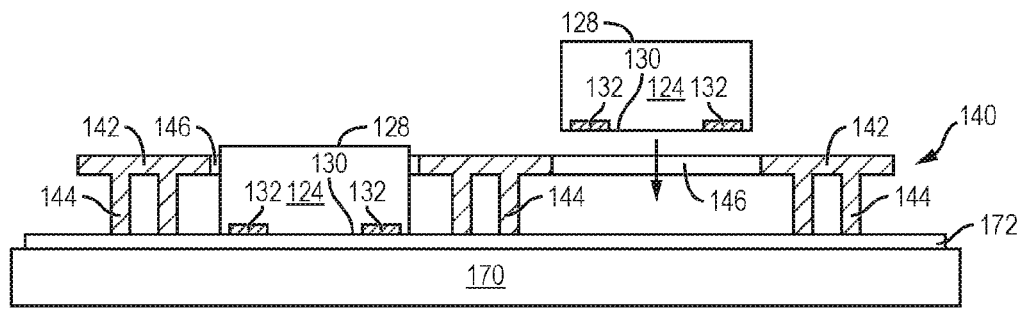
Figure 8G:
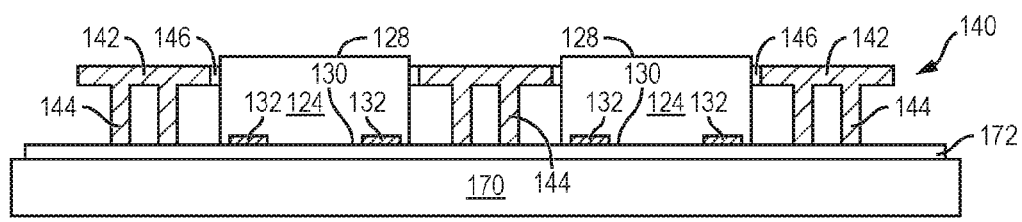
Figure 8H:
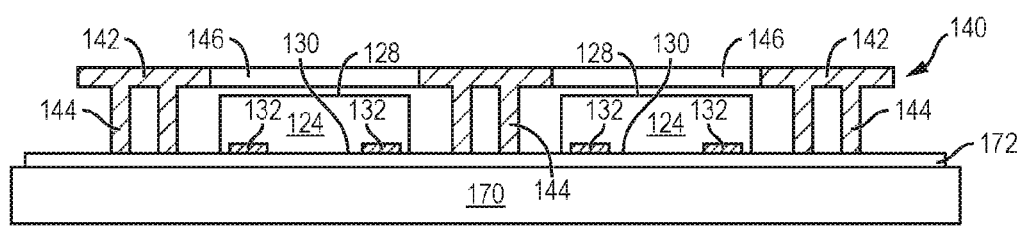
Figure 8I:
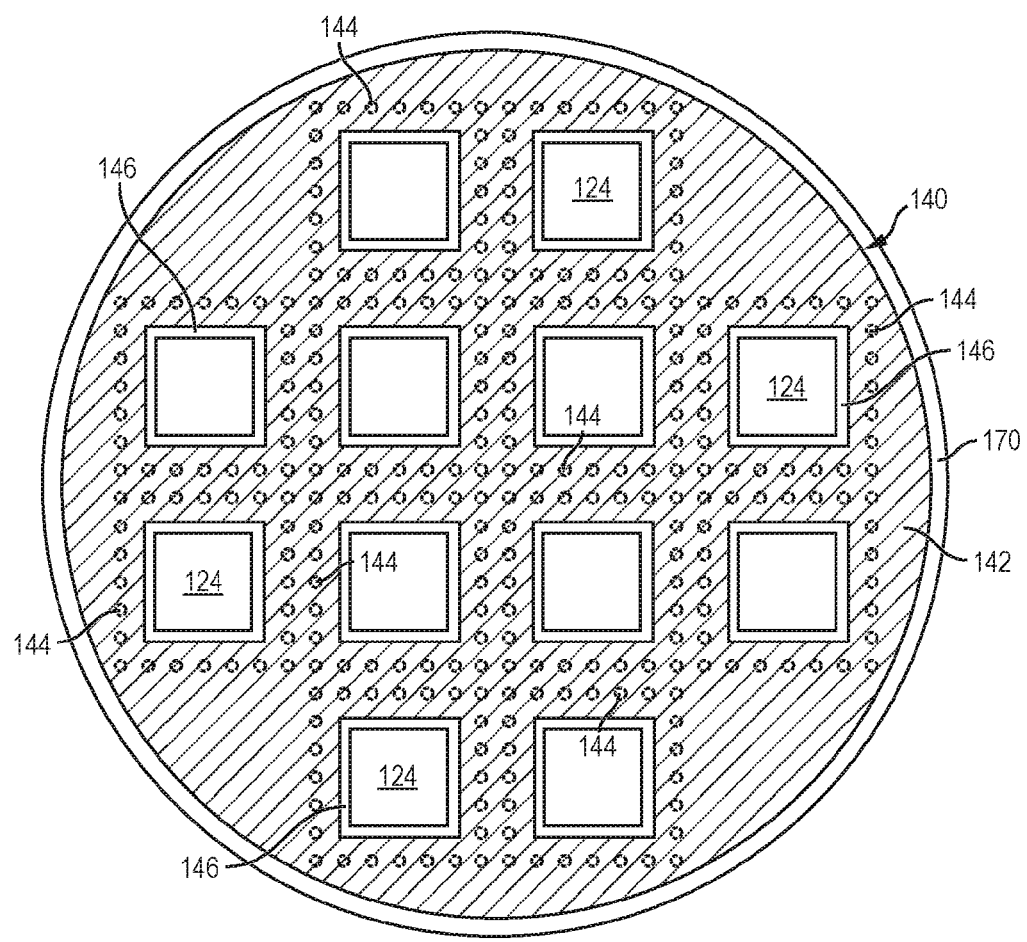
Figure 8J:
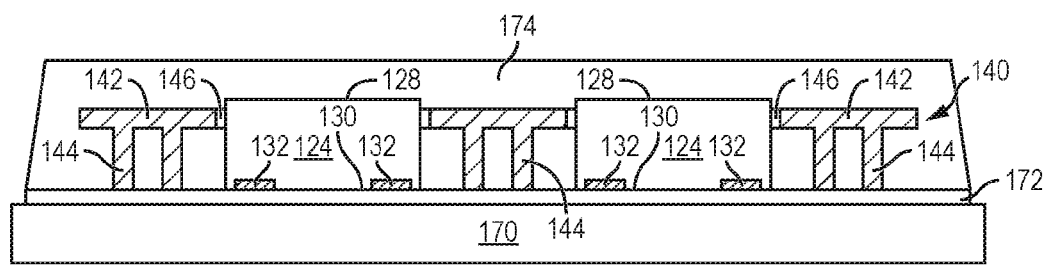
Figure 8K:
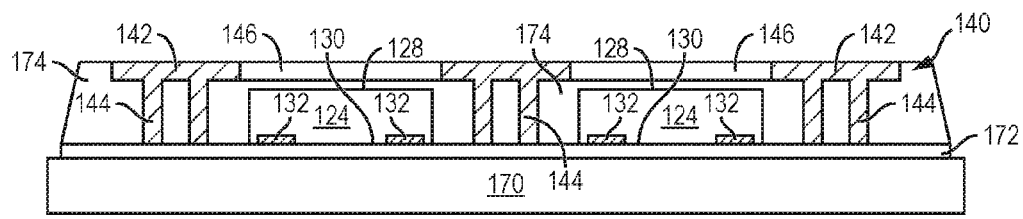
Figure 8L:
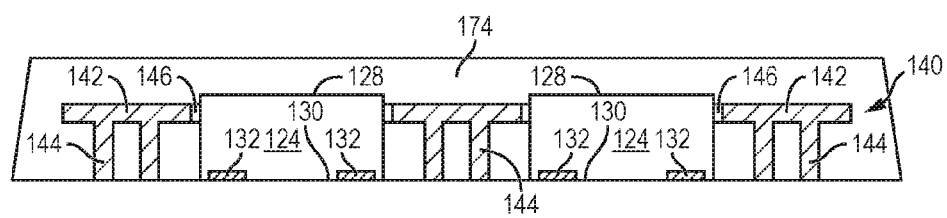
Figure 8M:
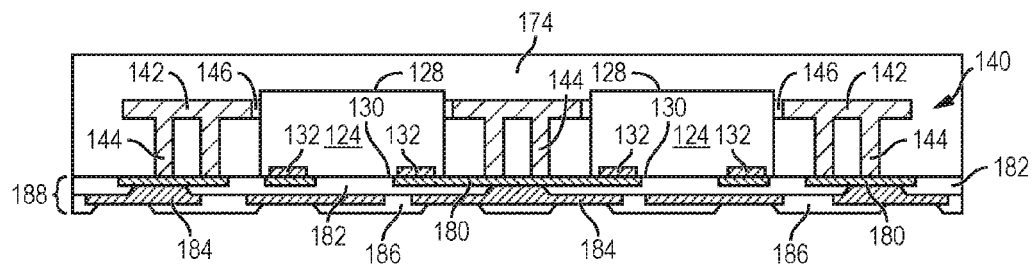
Figure 8N:
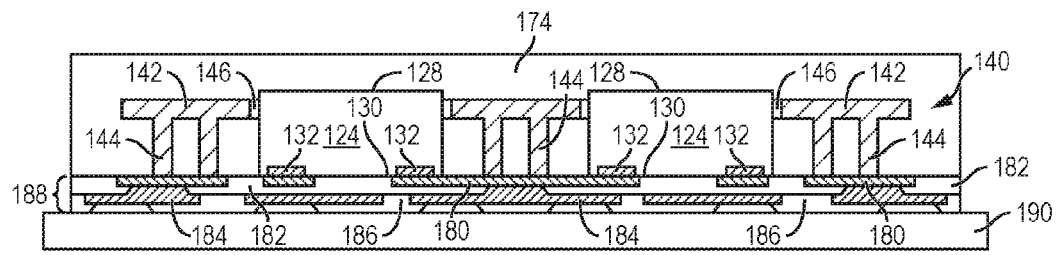
Figure 8O:
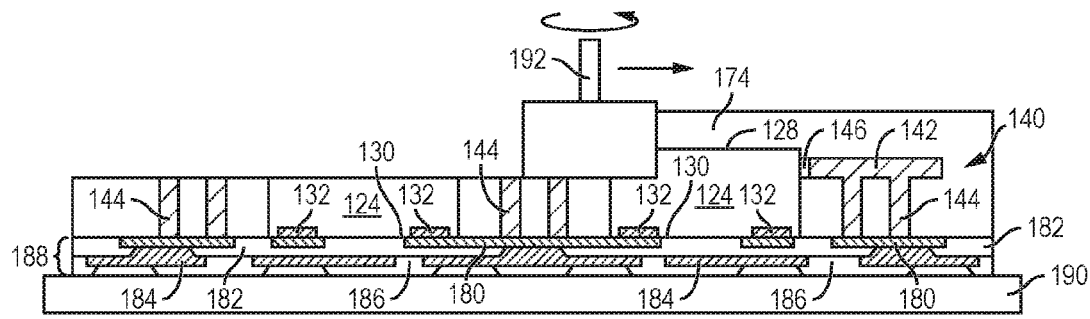
Figure 8P:
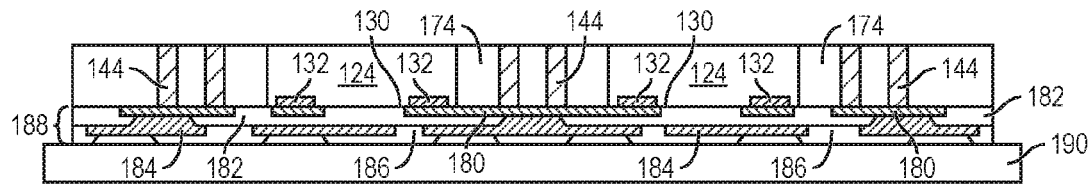
Figure 8Q:
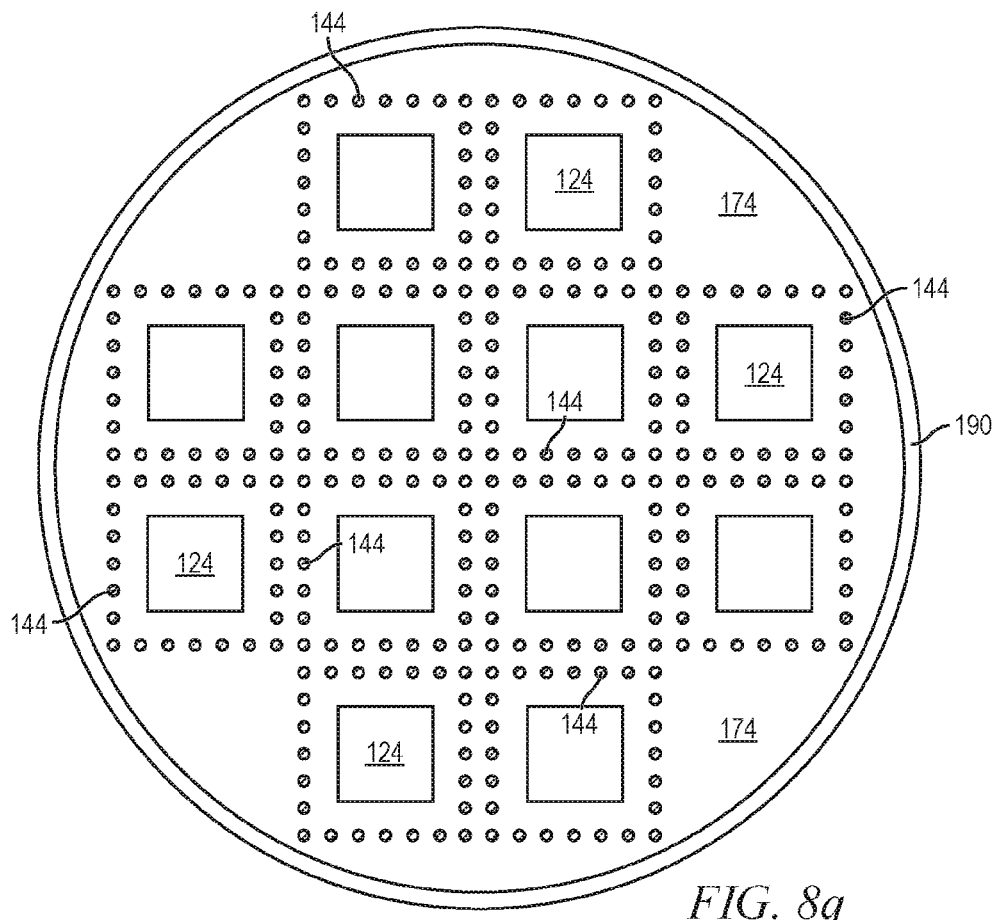
Figure 8R:
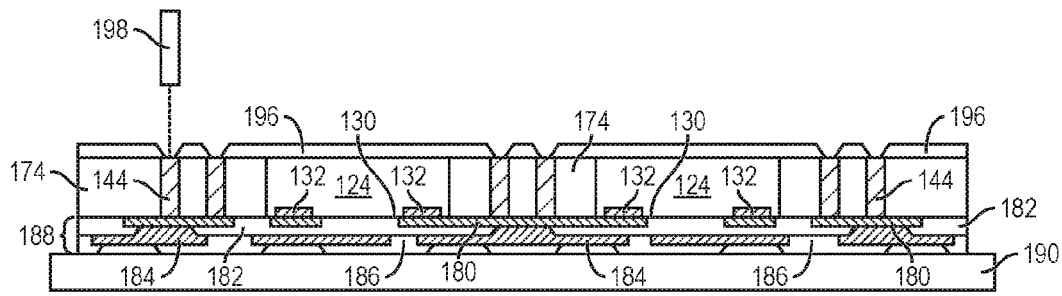
Figure 8S:
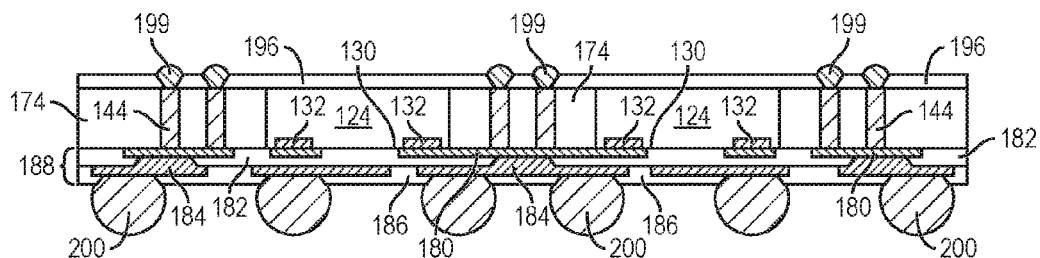
Figure 8T:
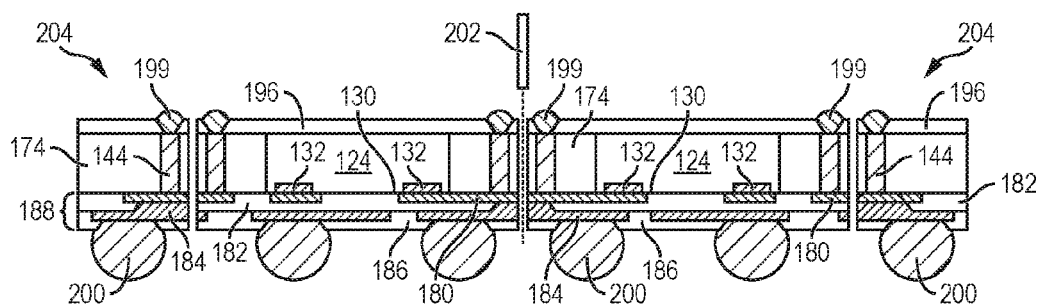

FIGS. 8a-8t illustrate, in relation to FIGS. 1 and 2a-2c, a process involving a substrate having a base and conductive posts to form a vertical interconnect structure in an embedded die package. FIG. 8a shows a plan view of carrier or temporary substrate 170 containing sacrificial base material such as silicon, polymer, beryllium oxide, glass, tape, or other suitable low-cost, rigid material for structural support. Carrier 170 can be wafer-shaped or rectangular. An adhesive layer or tape 172 is applied to carrier 170. FIG. 8b shows a cross-sectional view of carrier 170 and adhesive layer 172.

In FIG. 8c, substrate 140 is positioned over carrier 170 with conductive posts 144 oriented toward the carrier. FIG. 8d shows substrate 140 mounted to carrier 170 with conductive posts 144 secured to adhesive layer 172, taken along long 8d-8d of FIG. 8e, which shows a plan view of substrate 140 mounted to carrier 170.

If FIG. 8f, semiconductor die 124 from FIG. 3c is mounted to carrier 170 through opening 146 in substrate 140 using, for example, a pick and place operation with active surface 130 oriented toward the carrier. Semiconductor die 124 can also be mounted to carrier 170 through opening 156 in substrate 150, or through opening 166 in substrate 160. FIG. 8g shows semiconductor die 124 mounted to adhesive layer 172 of carrier 170 within opening 146 of substrate 140 and back surface 128 extending above substrate 140. FIG. 8h shows an alternate embodiment with semiconductor die 124 mounted to adhesive layer 172 of carrier 170 within opening 146 of substrate 140 and back surface 128 disposed below base 142 of substrate 140. FIG. 8i shows a plan view of semiconductor die 124 mounted to carrier 170 within openings 146 of substrate 140.

In FIG. 8j, an encapsulant or molding compound 174 is deposited over semiconductor die 124, substrate 140, and carrier 170 using a paste printing, compressive molding, transfer molding, liquid encapsulant molding, vacuum lamination, spin coating, or other suitable applicator. Encapsulant 174 can be polymer composite material, such as epoxy resin with filler, epoxy acrylate with filler, or polymer with proper filler. Encapsulant 174 is non-conductive and environmentally protects the semiconductor device from external elements and contaminants. FIG. 8k shows encapsulant 174 is deposited over semiconductor die 124, substrate 140, and carrier 170 in accordance with the embodiment of FIG. 8h.

In FIG. 8l, carrier 170 and adhesive layer 172 are removed by chemical etching, mechanical peeling, chemical mechanical planarization (CMP), mechanical grinding, thermal bake, UV light, laser scanning, or wet stripping to expose semiconductor die 124 and conductive posts 144.

In FIG. 8m, an electrically conductive layer or redistribution layer (RDL) 180 is formed over semiconductor die 124, conductive posts 144, and encapsulant 174 using a patterning and metal deposition process such as sputtering, electrolytic plating, and electroless plating. Conductive layer 180 can be one or more layers of Al, Cu, Sn, Ni, Au, Ag, or other suitable electrically conductive material. One portion of conductive layer 180 is electrically connected to conductive posts 144. Anther portion of conductive layer 180 is electrically connected to conductive layer 132 of semiconductor die 124. Other portions of conductive layer 180 can be electrically common or electrically isolated depending on the design and function of semiconductor die 124.

An insulating or passivation layer 182 is formed over semiconductor die 124, encapsulant 174, and conductive layer 180 using PVD, CVD, printing, spin coating, spray coating, sintering or thermal oxidation. The insulating layer 182 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 182 is removed to expose conductive layer 180.

An electrically conductive layer or RDL 184 is formed over conductive layer 180 and insulating layer 182 using a patterning and metal deposition process such as sputtering, electrolytic plating, and electroless plating. Conductive layer 184 can be one or more layers of Al, Cu, Sn, Ni, Au, Ag, or other suitable electrically conductive material. One portion of conductive layer 184 is electrically connected to conductive layer 180. Other portions of conductive layer 184 can be electrically common or electrically isolated depending on the design and function of semiconductor die 124.

An insulating or passivation layer 186 is formed over insulating layer 182 and conductive layer 184 using PVD, CVD, printing, spin coating, spray coating, sintering or thermal oxidation. The insulating layer 186 contains one or more layers of SiO2, Si3N4, SiON, Ta2O5, Al2O3, or other material having similar insulating and structural properties. A portion of insulating layer 186 is removed to expose conductive layer 184.

The combination of conductive layers 180 and 184 and insulating layers 182 and 186 constitutes a build-up interconnect structure 188 formed over semiconductor die 124, conductive posts 144, and encapsulant 174. Conductive layers 180 and 184 and insulating layers 182 and 186 may include an IPD, such as a capacitor, inductor, or resistor.

In FIG. 8n, a backing tape 190 is applied to build-up interconnect structure 188 for a backgrinding operation. In FIG. 8o, base 142 of substrate 140 and a portion of semiconductor die 124 and encapsulant 174 are removed by grinder 192. FIG. 8p shows the assembly after the backgrinding operation with conductive posts 144 electrically isolated within encapsulant 174. FIG. 8q shows a plan view of the assembly after the backgrinding operation with conductive posts 144 electrically isolated within encapsulant 174 around semiconductor die 124.

In FIG. 8r, an insulating or passivation layer 196 is formed over semiconductor die 124 and encapsulant 174 using PVD, CVD, printing, spin coating, spray coating, sintering or thermal oxidation. The insulating layer 196 contains one or more layers of SiO2, Si3N4, SiON, Ta2O5, Al2O3, or other material having similar insulating and structural properties. A portion of insulating layer 196 is removed by laser direct ablation (LDA) using laser 198 to expose conductive posts 144. Alternatively, a portion of insulating layer 196 is removed by an etching process through a patterned photoresist layer to expose conductive posts 144. An optional solder material or preservation coating 199 can be applied over conductive posts 144 exposed from insulating layer 196.

In FIG. 8s, backing tape 190 is removed. An electrically conductive bump material is deposited over conductive layer 184 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. The bump material is bonded to conductive layer 184 using a suitable attachment or bonding process. In one embodiment, the bump material is reflowed by heating the material above its melting point to form balls or bumps 200. In some applications, bumps 200 are reflowed a second time to improve electrical contact to conductive layer 184. In one embodiment, bumps 200 are formed over a UBM having a wetting layer, barrier layer, and adhesive layer. The bumps can also be compression bonded or thermocompression bonded to conductive layer 184. Bumps 200 represent one type of interconnect structure that can be formed over conductive layer 184. The interconnect structure can also use bond wires, conductive paste, stud bump, micro bump, or other electrical interconnect.

Figure 9:
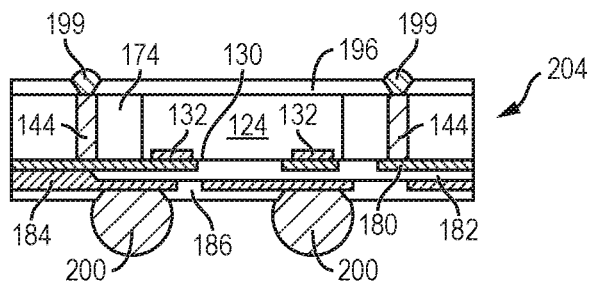
FIG. 9 illustrates the embedded die package with conductive posts as a vertical interconnect structure.

In FIG. 8t, semiconductor die 124 are singulated through encapsulant 174 between conductive posts 144 with saw blade or laser cutting tool 202 into individual embedded die packages 204. FIG. 9 shows embedded die package 204 after singulation. Semiconductor die 124 is electrically connected through interconnect structure 188 to conductive posts 144, which provide vertical electrical interconnect for the embedded die. Conductive posts 144 are formed in encapsulant 174 by placing substrate 140-160 over carrier 170 and disposing semiconductor die 124 within openings in the substrate. The base of the substrate is removed to electrically isolate the conductive posts. Build-up interconnect structure 188 is formed over semiconductor die 124 and encapsulant 174.

Figure 10A:
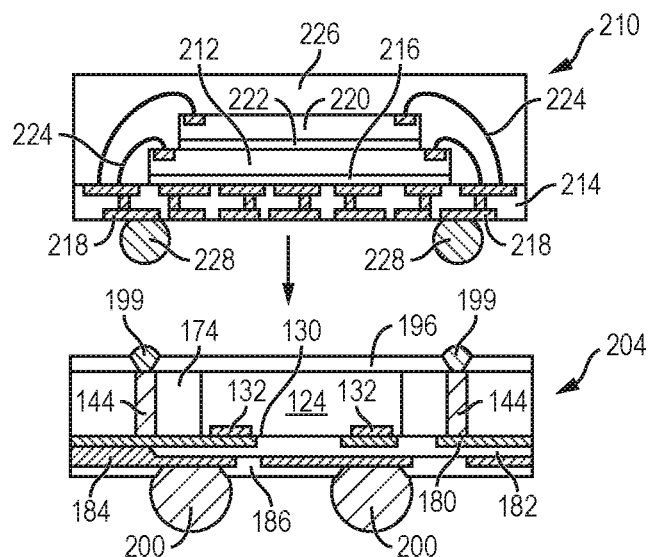
FIGS. 10a-10b illustrate a PoP arrangement with the embedded die package having conductive posts as vertical interconnect.
Figure 10B:
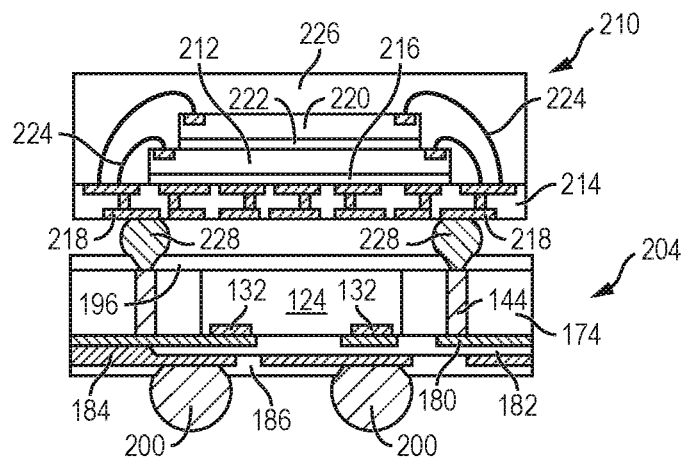

FIGS. 10a-10b show an embodiment for stacking semiconductor packages in a package-on-package (PoP) arrangement. In FIG. 10a, semiconductor package 210 includes semiconductor die or component 212 mounted to substrate 214 with die attach adhesive 216. Substrate 214 includes conductive traces 218. Semiconductor die or component 220 mounted to semiconductor die 212 with die attach adhesive 222. A plurality of bond wires 224 is connected between contact pads formed on active surfaces of semiconductor die 212 and 220 and conductive traces 218 of substrate 214. An encapsulant 226 is deposited over semiconductor die 212 and 220, substrate 214, and bond wires 224. Bumps 228 are formed over conductive traces 218 of substrate 214 opposite semiconductor die 212 and 220.

FIG. 10b shows semiconductor package 210 mounted to embedded die package 204 from FIG. 5 with bumps 228 bonded to conductive posts 144 as PoP 230.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a carrier;
   a substrate including a base and a plurality of conductive posts extending from the base, wherein the substrate is disposed over the carrier with the conductive posts oriented toward the carrier and each of the conductive posts is physically connected to each other by the base;
   a semiconductor die disposed over the carrier between the conductive posts, wherein the semiconductor die is aligned with an opening formed through the base of the substrate such that the base of the substrate extends continuously completely around the semiconductor die in plan view; and
   an encapsulant deposited over the carrier, substrate, and semiconductor die.

2. The semiconductor device of claim 1, wherein a height of the semiconductor die is greater than a height of the substrate, wherein the semiconductor die extends through the opening of the substrate.

3. The semiconductor device of claim 1, wherein the base of the substrate includes a notch opposite the conductive posts.

4. The semiconductor device of claim 1, wherein the substrate includes a rectangular shape.

5. The semiconductor device of claim 1, wherein the substrate includes a circular shape.

6. The semiconductor device of claim 1, wherein the conductive posts include a tapered portion.

7. A semiconductor device, comprising:
   a substrate including a base, an opening formed through the base, and a plurality of conductive posts extending from the base, wherein the base physically couples the conductive posts together;
   a semiconductor die disposed between the conductive posts over the opening, wherein an active surface of the semiconductor die is aligned with ends of the conductive posts; and
   an encapsulant deposited over the substrate and semiconductor die, wherein a surface of the encapsulant is coplanar with the active surface of the semiconductor die and the ends of the conductive posts.

8. The semiconductor device of claim 7, further including an interconnect structure formed over the surface of the encapsulant and electrically connected to the conductive posts and the semiconductor die.

9. The semiconductor device of claim 8, further including a conductive bump formed over the interconnect structure.

10. The semiconductor device of claim 7, wherein the semiconductor die extends through the opening.

11. The semiconductor device of claim 7, further including a carrier contacting the encapsulant, the active surface of the semiconductor die, and the ends of the conductive posts.

12. The semiconductor device of claim 7, wherein each of the conductive posts includes a tapered portion.

13. A semiconductor device, comprising:
   a substrate including a base, a plurality of conductive posts extending from the base, and an opening formed through the base between the conductive posts; and
   a semiconductor die disposed over the substrate and aligned with the opening, wherein the opening extends completely around the semiconductor die in plan view.

14. The semiconductor device of claim 13, further including a conductive layer disposed over the substrate between the semiconductor die and conductive posts.

15. The semiconductor device of claim 13, wherein the semiconductor die extends through the opening.

16. The semiconductor device of claim 13, wherein the conductive posts include a tapered portion.

17. The semiconductor device of claim 13, further including an encapsulant deposited over the substrate and semiconductor die.

18. The semiconductor device of claim 17, wherein a surface of the encapsulant is coplanar with an active surface of the semiconductor die and ends of the conductive posts.

19. A leadframe for a semiconductor device, comprising:
   a base;
   an opening formed through the base; and
   a plurality of conductive posts extending from the base around the opening including a first row of conductive posts on a first side of the opening and a second row of conductive posts on a second side of the opening opposite the first side, wherein the base extends partially between the first row and second row toward the opening and the opening extends for a majority of a distance between the first row and second row.

20. The leadframe of claim 19, further including a semiconductor die disposed within the opening of the base and between the conductive posts.

21. The leadframe of claim 20, further including an encapsulant deposited over the leadframe and semiconductor die.

22. The leadframe of claim 20, further including a conductive layer disposed between the semiconductor die and conductive posts.

23. The leadframe of claim 19, wherein the conductive posts include a tapered portion.

24. The leadframe of claim 19, wherein the base and conductive posts are formed from a continuous portion of conductive material.

* * * * *